US012772445B2

(12) United States Patent
Yang et al.

(10) Patent No.: US 12,772,445 B2
(45) Date of Patent: Oct. 20, 2026

(54) PROGRAMMABLE DEVICE AND METHOD FOR FABRICATING THE SAME

(71) Applicant: United Microelectronics Corp., Hsinchu (TW)

(72) Inventors: Tsung-Yu Yang, Chiayi County (TW); Yuan-Chin Liu, Tainan City (TW); Chang-Ta Chiang, Hsinchu City (TW); Cheng-Tzung Tsai, Taipei City (TW); Che-Hao Kuo, Tainan City (TW); Hong-Ru Liu, Chiayi County (TW)

(73) Assignee: UNITED MICROELECTRONICS CORP, Hsinchu (TW)

( * ) Notice: Subject to any disclaimer, the term of this patent is extended or adjusted under 35 U.S.C. 154(b) by 309 days.

(21) Appl. No.: 18/752,832

(22) Filed: Jun. 25, 2024

(65) Prior Publication Data

US 2025/0380407 A1 Dec. 11, 2025

(30) Foreign Application Priority Data

Jun. 6, 2024 (TW) ................................ 113121025

(51) Int. Cl.

| | |
|---|---|
| ***H10B 20/25*** | (2023.01) |
| ***H10D 62/10*** | (2025.01) |
| ***H10W 10/00*** | (2026.01) |
| ***H10W 10/17*** | (2026.01) |

(52) U.S. Cl.

CPC ........... *H10B 20/25* (2023.02); *H10D 62/116* (2025.01); *H10W 10/014* (2026.01); *H10W 10/17* (2026.01)

(58) Field of Classification Search

CPC .. H10B 20/25; H10W 10/0145; H10W 10/17; H10W 20/491; H10W 20/493

See application file for complete search history.

(56) References Cited

U.S. PATENT DOCUMENTS

| | | | | |
|---|---|---|---|---|
| 6,130,469 | A | 10/2000 | Bracchitta et al. | |
| 8,772,907 | B1 | 7/2014 | Ho | |
| 8,922,328 | B2 | 12/2014 | Wu et al. | |
| 9,548,178 | B2 | 1/2017 | Shu | |
| 10,366,921 | B2 | 7/2019 | Rou | |
| 10,580,780 | B2 | 3/2020 | Liu et al. | |
| 2003/0098495 | A1 * | 5/2003 | Amo ...................... | H10D 84/40 257/209 |
| 2007/0257331 | A1 * | 11/2007 | Kurjanowicz ......... | G11C 17/16 257/E21.666 |

(Continued)

*Primary Examiner* — Alia Sabur

(74) *Attorney, Agent, or Firm* — WPAT, PC

(57) ABSTRACT

A programmable device includes a semiconductor substrate, a buried insulator, a semiconductor oxide layer and a planarized conductive layer. The buried insulator is disposed in the semiconductor substrate and has a first insulating portion and a second insulating portion connected to each other. The semiconductor oxide layer is at least partially disposed in the semiconductor substrate and contacting with the first insulating portion. The planarized conductive layer at least partially covers the first insulating portion, the second insulating portion and the semiconductor oxide layer, and has a flat surface. There is a first distance between the first insulating portion and the flat surface; there is a second distance between the second insulating portion and the flat surface; and the first distance is smaller than the second distance.

15 Claims, 5 Drawing Sheets

(56) References Cited

U.S. PATENT DOCUMENTS

| | | | | |
|---|---|---|---|---|
| 2009/0224325 | A1* | 9/2009 | Min | H10B 20/00 257/355 |
| 2010/0032732 | A1* | 2/2010 | Booth, Jr. | H10B 20/25 257/E21.409 |
| 2010/0213570 | A1* | 8/2010 | Min | H10W 20/491 257/E21.575 |
| 2011/0103127 | A1* | 5/2011 | Kurjanowicz | G11C 17/16 257/209 |
| 2014/0175601 | A1* | 6/2014 | Ho | H10W 20/01 438/467 |
| 2014/0209989 | A1* | 7/2014 | Kurjanowicz | G11C 17/16 438/281 |
| 2017/0125427 | A1* | 5/2017 | Shum | H10B 20/25 |
| 2023/0197523 | A1 | 6/2023 | Hsu et al. | |

* cited by examiner

PROGRAMMABLE DEVICE AND METHOD FOR FABRICATING THE SAME

This application claims the benefit of Taiwan Application Serial No. 113121025 filed at Jun. 6, 2024 the subject matter of which is incorporated herein by reference.

BACKGROUND

Technical Field

The disclosure relates to a semiconductor device and the method for fabricating the same, and more particularly to a programmable device and the method for fabricating the same.

Description of Background

In an integrated circuit (IC) manufacturing process, more than millions of electronic devices are formed on a single wafer or chip. Some defects occurring in certain electronic devices may cause the IC failure. However, aborting the subsequent process and discarding the wafer or chip just because of the minor defects may lead to a waste of the process costs. The existing technology currently provides a one-time programmable (OTP) device, such as an electric fuse/anti-fuse fault tolerance design, widely arranged in ICs. The IC can be repaired by either blowing out an electrical fuse to block an originally conductive circuit path or blowing out an anti-fuse to shorting the originally non-conductive path to discard the defect electronic device. Such that, the operational functionality of the IC can be maintained without scrapping the entire wafer or die.

However, it (taking a typical electric fuse as an example) is provided by forming an additional patterned conductor layer. This will not only significantly increase the number of photomasks (reticles) used in the semiconductor manufacturing process, but will also increase the layout area and thickness of the IC, and is not conducive to the miniaturization of the IC.

Therefore, there is a need of providing a programmable device and the method for fabricating the same to obviate the drawbacks encountered from the prior art.

SUMMARY

One aspect of the present disclosure is to provide a programmable device includes a semiconductor substrate, a buried insulator, a semiconductor oxide layer and a planarized conductive layer. The buried insulator is disposed in the semiconductor substrate and has a first insulating portion and a second insulating portion connected to each other. The semiconductor oxide layer is at least partially disposed in the semiconductor substrate and contacting with the first insulating portion. The planarized conductive layer at least partially covers the first insulating portion, the second insulating portion and the semiconductor oxide layer, and has a flat surface. There is a first distance between the first insulating portion and the flat surface; there is a second distance between the second insulating portion and the flat surface; and the first distance is smaller than the second distance.

Another aspect of the present disclosure is to provide a method for fabricating a programmable device, wherein the method includes steps as follows: Firstly, a semiconductor substrate is provided, and a buried insulator is formed in the semiconductor substrate, wherein the buried insulator has a first insulating portion and a second insulating portion connected to each other. A semiconductor oxide layer is formed at least partially disposed in the semiconductor substrate and contacting with the first insulating portion. A planarized conductive layer is formed to at least partially cover the first insulating portion, the second insulating portion and the semiconductor oxide layer, wherein the planarized conductive layer has a flat surface; there is a first distance between the first insulating portion and the flat surface; there is a second distance between the second insulating portion and the flat surface; and the first distance is smaller than the second distance.

In accordance with the aforementioned embodiments of the present disclosure, a programmable device and the method for fabricating the same are provided. Firstly, a buried insulator (which can be a STI) is formed, extending downward from a surface of a semiconductor substrate. A semiconductor oxide layer (for example, a silicon oxide layer) is then formed by a thermally oxidation process performed on the surface of the semiconductor substrate, so as to make the semiconductor oxide layer contact with the buried insulator. Next, a planarized conductive layer is formed and blankets over the buried insulator and the semiconductor oxide layer. A corner can be formed on a top of the first insulating portion of the buried insulator due to a warping of the buried insulator caused by the push (a thermal stress) of the semiconductor oxide layer applying to the first insulating portion. So that, the first distance between the first insulating portion (at the corner) and the flat surface of the planarized conductive layer is less than the second distance between the unwarped second insulating portion and the flat surface of the planarized conductive layer. Subsequently, a first contact structure is formed on a first conductive region of the planarized conductive layer corresponding to the second insulating portion, and a second contact structure is formed on a second conductive region of the planarized conductive layer corresponding to the semiconductor oxide layer.

Since the thickness of the portion of the planarized conductive layer corresponding to the first insulating portion (the corner) is thinner than the other portions of the planarized conductive layer, thus it can serve as a programmable device having an electric fuse structure. Moreover, the process steps for making the programmable device can be integrated with the standard process steps for making existing semiconductor devices. Therefore, the electric fuse structure can be provided through the standard manufacturing processes for fabricating the existing semiconductor device without applying additional photomask (reticle) and manufacturing process other than the standard manufacturing processes, which can greatly improve the yield and process efficiency of semiconductor devices.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
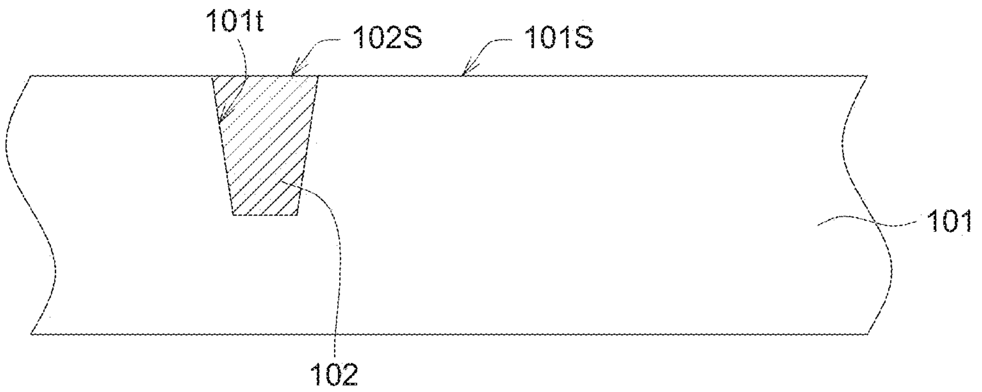
FIG. 1A to FIG. 1I are diagrams illustrating a series of process structures for producing of a programmable device, according to one embodiment of the present disclosure.

The embodiments as illustrated below provide a programmable device and the method for fabricating the same, which can be provided through the standard manufacturing processes for fabricating an existing semiconductor device without applying additional photomask (reticle) and manufacturing process other than the standard manufacturing processes. Such that it can greatly improve the yield and process efficiency of semiconductor devices. The present disclosure will now be described more specifically with reference to the following embodiments illustrating the structure, method and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIG. 1A to FIG. 1I are diagrams illustrating a series of process structures for producing of a programmable device 100, according to one embodiment of the present disclosure. The method for forming the programmable device 100 includes steps as follows:

Firstly, a semiconductor substrate 101 is provided, and a buried insulator 102 is formed in the semiconductor substrate 101 (as shown in FIG. 1A). In some embodiments of the present disclosure, the semiconductor substrate 101 may be a silicon-containing substrate, such as a silicon (Si) wafer or a silicon-on-insulator (SOI) substrate. In some other embodiments of the present disclosure, the semiconductor substrate 101 may be made of other types of semiconductor materials, such as germanium (Ge), or compound semiconductor materials, such as gallium arsenide (GaAs). In the present embodiment, the semiconductor substrate 101 may be a silicon wafer.

The buried insulator 102 may be a shallow trench isolation structure (STI) formed in the semiconductor substrate 101. In the present embodiment, the forming of the buried insulator 102 includes steps as follows: Firstly, the semiconductor substrate 101 is patterned by a photolithography etching process to form at least one trench 101*t* in the semiconductor substrate 101, extending downward into the semiconductor substrate 101 from a substrate surface 101S. Next, through a deposition process, dielectric material is deposited on the substrate surface 101S and fills the trench 101*t*. Then, a planarization process (for example, a chemical mechanical polishing (CMP) process) or an etch-back process is used to remove the portion of dielectric material disposed above the surface 101S of the semiconductor substrate 101 to form a STI (serving as the buried insulator 102) in the trench 101*t*. The buried insulator 102 passes through the surface 101S of the semiconductor substrate 101 and extends downwardly into the semiconductor substrate 101. In the present embodiment, the STI (the buried insulator 102) has an original top surface 102S that is substantially flush with the surface 101S of the semiconductor substrate 101.

Figure 1B:
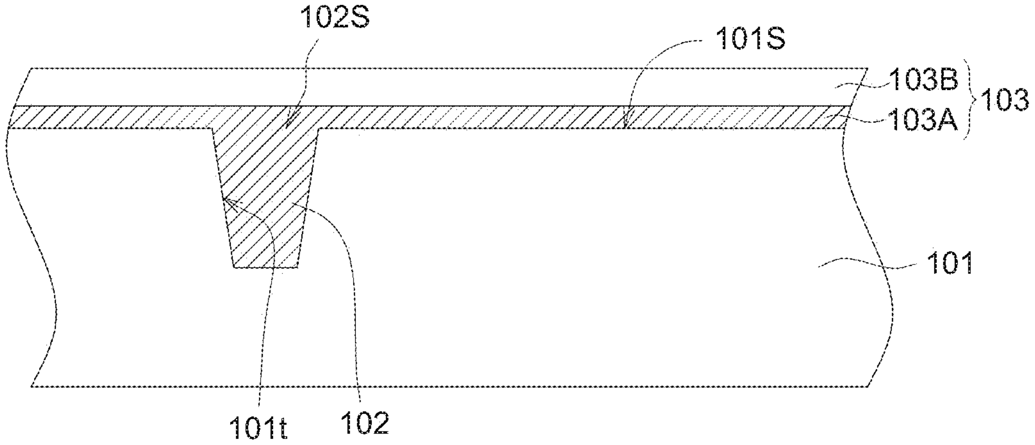

Afterwards, a hard mask layer 103 is deposited on the surface 101S of the semiconductor substrate 101 and the original top surface 102S of the buried insulator 102. In some embodiments of the present disclosure, the hard mask layer 103 includes (but not limited to) a pad oxide layer 103A and a silicon nitride layer 103B sequentially stacked over the surface 101S of the semiconductor substrate 101 and the original top surface 102S of the buried insulator 102 (as shown in FIG. 1B).

Next, a semiconductor oxide layer 105 is formed, at least partially disposed in the semiconductor substrate 101, and contacting with a first insulating portion 102A of the buried insulator 102. In some embodiments of the present disclosure, the forming of the semiconductor oxide layer 105 includes the following steps: Firstly, the hard mask layer 103 is patterned to form an opening 1030, from which a portion of the original top surface 102S of the buried insulator 102 and a portion of the surface 101S of the semiconductor substrate 101 can be exposed.

Figure 1C:
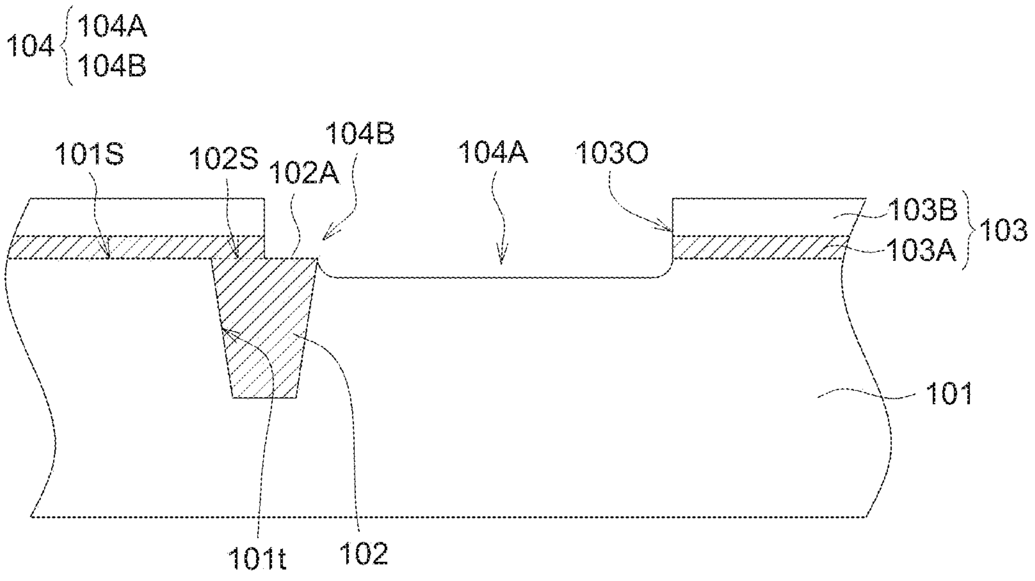
Figure 1D:
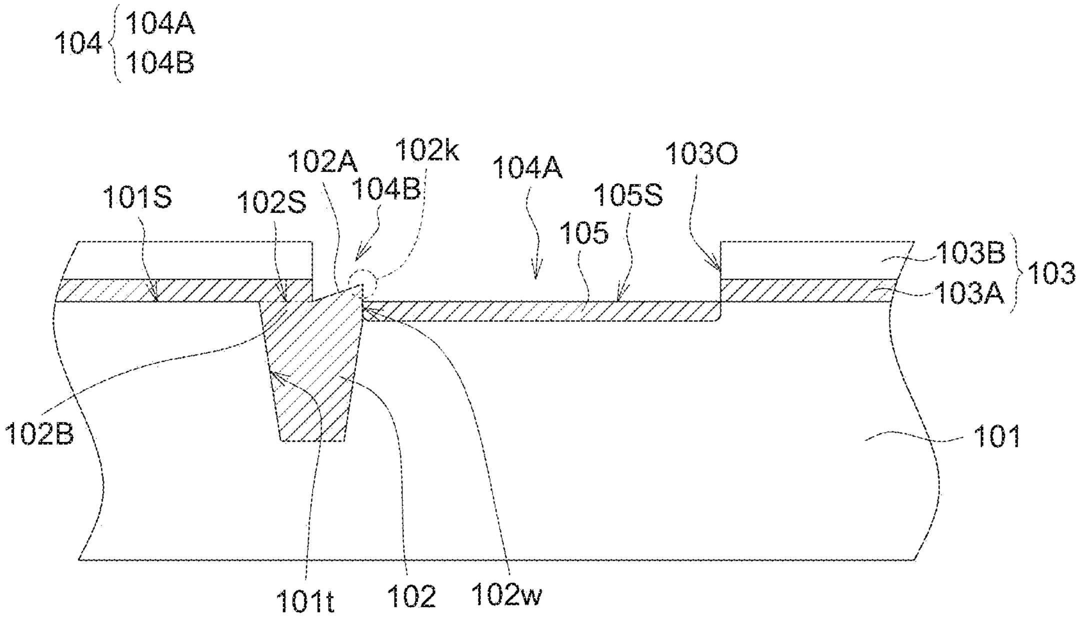

An etching process is performed, using the patterned hard mask layer 103 as an etching mask, to remove a portion of the buried insulator 102 and a portion of the semiconductor substrate 101, so as to form a sub-opening 104A on the surface 101S of the semiconductor substrate 101, and to form another sub-opening 104B on the original top surface 102S of the buried insulator 102. Wherein, the sub-opening 104A and the sub-opening 104B are connected with each other to form an opening 104, from which a portion of the semiconductor substrate 101 and the first insulating portion 102A of the buried insulator 102 can be exposed. In the present embodiment, the depth of the sub-opening 104A is greater than the depth of the sub-opening 104B (as shown in FIG. 1C).

Then, a thermal oxidation process is performed to oxidize the exposed portion of the semiconductor substrate 101, thereby forming the semiconductor oxide layer 105 in the sub-opening 104A contacting with the side wall 102*w* of the first insulating portion 102A of the buried insulator 102 exposed form the sub-opening 104B. In the present embodiment, the semiconductor oxide layer 105 may be made of silicon dioxide. Since the semiconductor oxide layer 105 formed by a thermal oxidation process which may generate a thermal stress and laterally apply on the sidewall 102*w* of the first insulating portion 102A of the buried insulator 102, thus the first insulating portion 102A of the buried insulator 102 can be warped to form a corner 102*k*. In the present embodiment, the upper surface 105S of the semiconductor oxide layer 105 is substantially flush with the surface 101S of the semiconductor substrate 101; and the corner 102*k* of the first insulating part 102A of the buried insulator 102 is substantially higher than (but not limited to) the upper surface 105S of the semiconductor oxide layer 105.

Subsequently, a planarized conductive layer 106 is formed to at least partially cover the first insulating portion 102A, the second insulating portion 102B (that is not exposed by the opening 104) and the semiconductor oxide layer 105, wherein the first insulating portion 102A connects with the second insulating portion 102B, and the planarized conductive layer has 106 a flat surface 106S.

Figure 1E:
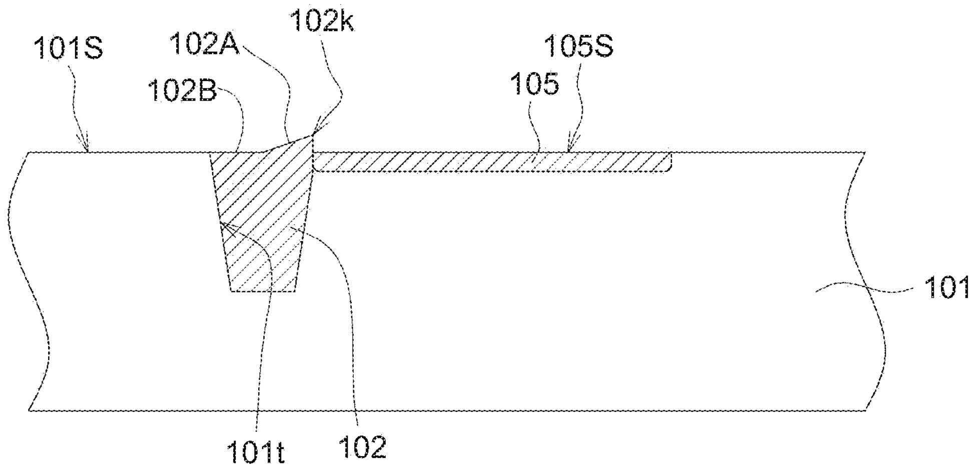

The forming of the planarized conductive layer 106 includes the steps as follows: Firstly, the patterned hard mask layer 103 is remove (as shown in FIG. 1E). Then, a deposition process, such as a chemical vapor deposition (CVD) process, is performed to form a poly-silicon thin layer 107 to cover the first insulating portion 102A and the second insulating portion 102B of the buried insulator 102, the surface 101S of the semiconductor substrate 101 and the upper surface 105S of the semiconductor oxide layer 105. The poly-silicon thin layer 107 has a protrusion 107*a* corresponding to the corner 102*k* of the buried insulator 102.

Figure 1F:
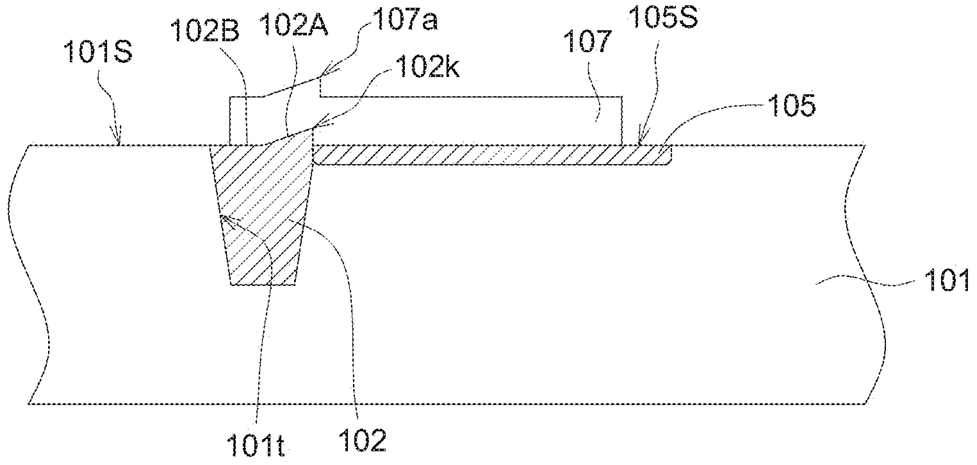

The poly-silicon thin layer 107 is then patterned using a photolithographic etching process, so that the patterned poly-silicon thin layer 107 covers the first insulating portion 102A (including the corners 102*k*) of the buried insulator 102, the second insulating portion 102B connected to the first insulating portion 102A and the portion of the semiconductor oxide layer 105 connected to the first insulating portion 102A (as shown in FIG. 1F).

Figure 1G:
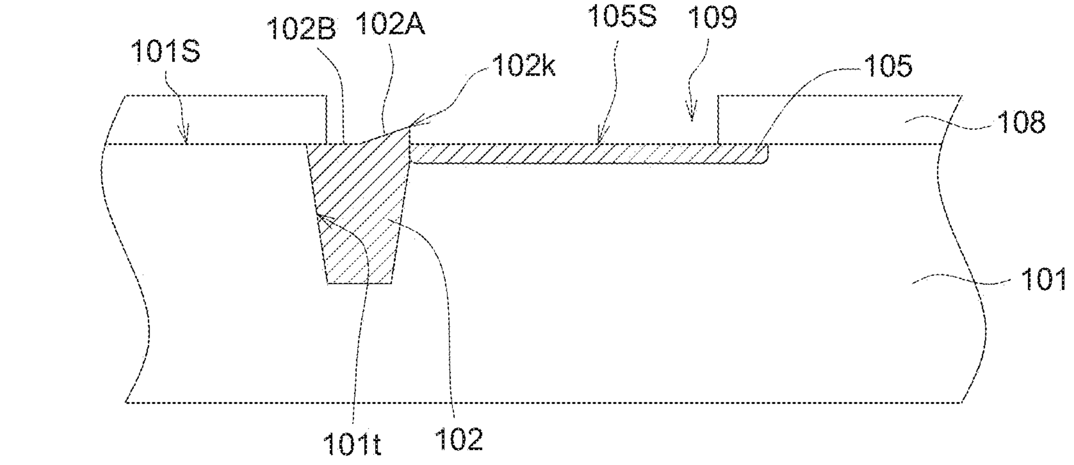

Next, an interlayer dielectric layer 108 is formed on the exposed portion of the surface 101S of the semiconductor substrate 101, and the patterned poly-silicon thin layer 107 is removed to form another opening 109. Such that, the first insulating portion 102A (including the corners 102*k*), a portion of the second insulating portion 102B of the buried insulator 102 and a portion of the semiconductor oxide layer 105 that are originally covered by the patterned poly-silicon thin layer 107 can be exposed from the opening 109 (as shown in FIG. 1G).

Figure 1H:
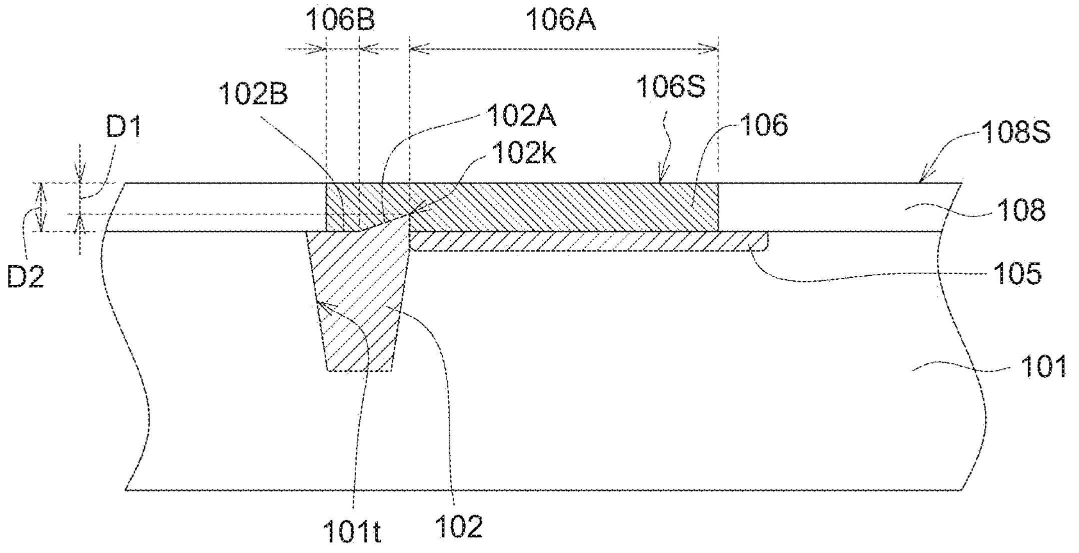

Afterwards, a conductive material is deposited on the interlayer dielectric layer 108 and fills the opening 109. Then, a planarization process, such as a CMP process, is performed using the interlayer dielectric layer 108 as a stop layer to remove the portion of the conductive material disposed above the interlayer dielectric layer 108 and form the planarized conductive layer 106 in the opening 109. In the present embodiment, the flat surface 106S of the planarized conductive layer 106 is substantially flush with the upper surface 108S of the interlayer dielectric layer 108. There is a first distance D1 between the flat surface 106S and the corner 102*k* of the first insulating part 102A of the buried insulator 102; there is a second distance D2 between the flat surface 106S and the second insulating part 102B of the buried insulator 102; and the second distance D2 is smaller than the first distance D1 (as shown in FIG. 1H).

In some embodiments of the present disclosure, the first distance D1 may substantially rage between 50 Angstroms (Å) and 100 Angstroms. For example, the first distance D1 may be about 60 Å, preferably about 90 Å. The second distance D2 may substantially rage between 250 Å and 300 Å. The ratio of the first distance D1 to the second distance D2 (D1/D2) may substantially range between 0.2 and 0.4, and preferably may be, for example, 0.3.

Figure 1I:
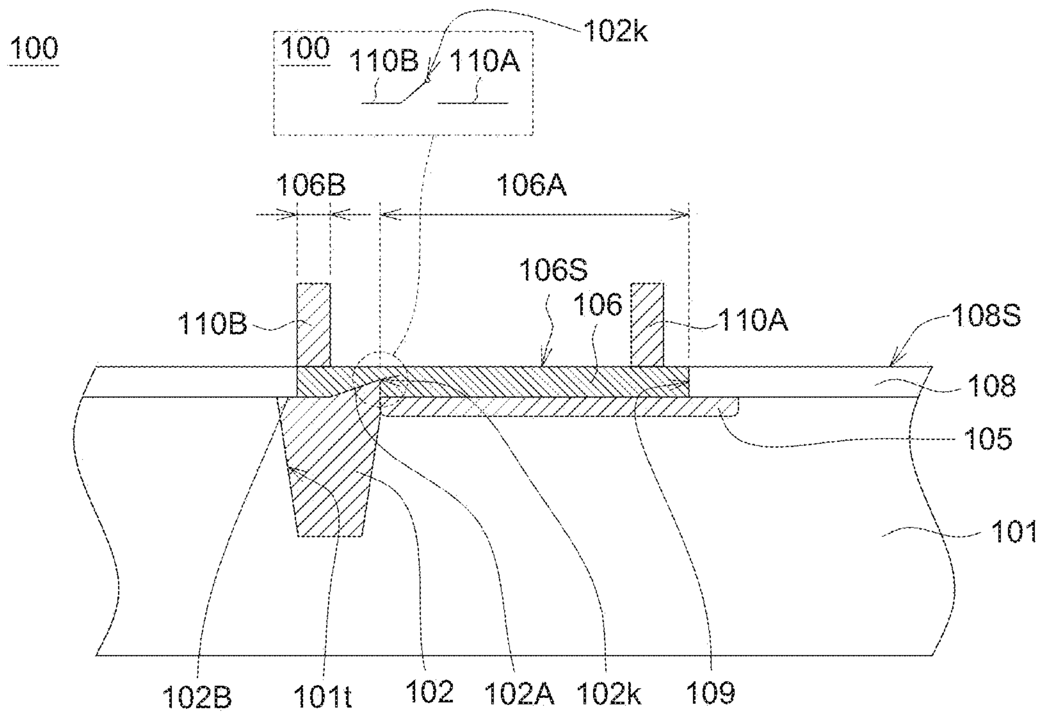

Subsequently, a series of downstream processes, such as a metal damascene process, are performed to form at least one contact structure (e.g., conductive pad) 110A on a first conductive region 106A of the planarized conductive layer 106 corresponding to the semiconductor oxide layer 105, and to form at least one second contact structure (e.g., conductive pad) 110B on a second conductive region 106B of the planarized conductive layer 106 corresponding to the second insulating portion 102B of the buried insulator 102, so as to complete the preparation of the programmable device 100 as shown in FIG. 1I.

In the present embodiment, the programmable device 100 includes a semiconductor substrate 101, a buried insulator 102, a semiconductor oxide layer 105 and a planarized conductive layer 106. The buried insulator 102 is disposed in the semiconductor substrate 101 and has a first insulating portion 102A and a second insulating portion 102B connected to each other. The semiconductor oxide layer 105 is at least partially embedded in the semiconductor substrate 101 and contacts with the first insulating portion 102A of the buried insulator 102. The planarized conductive layer 106 at least partially blankets over the first insulating portion 102A and the second insulating portion 102B of the buried insulator 102 as well as over the semiconductor oxide layer 105, and has a flat surface 106S. There is a first distance D1 between the first insulating portion 102A and the flat surface 106S; there is a second distance D2 between the second insulating portion 102B and the flat surface 106S; and the first distance D1 is less than the second distance D2 (D1<D2).

Since the portion of the planarized conductive layer 106 corresponding to the corner 102*k* of the first insulating portion 102A has a thickness (approximately equal to the first distance D1) thinner than the thickness (approximately equal to the second distance D2) of the portions of the planarized conductive layer 106 in the conductive region 106A and the second conductive region 106B, thus it is easier to be burn down to cause a short circuit and serve as an electric fuse structure. Moreover, the above process steps for manufacturing the programmable device 100 can be identified to some of the standard processes for manufacturing an existing semiconductor device. In other words, the process steps for manufacturing the programmable device 100 can be integrated with the standard processes of the existing semiconductor device to form the programmable device 100 with an electric fuse structure without additional photo masks and manufacturing fabrication other than the standard processes. When a fault is detected in the electronic device or the IC applying the programmable device 100 during the manufacturing process, the circuit path of the electronic device or the IC can be rearranged by blowing the electric fuse structure of the programmable device 100, so as to troubleshoot and maintain normal operating functions of the electronic device or the IC.

Figure 2:
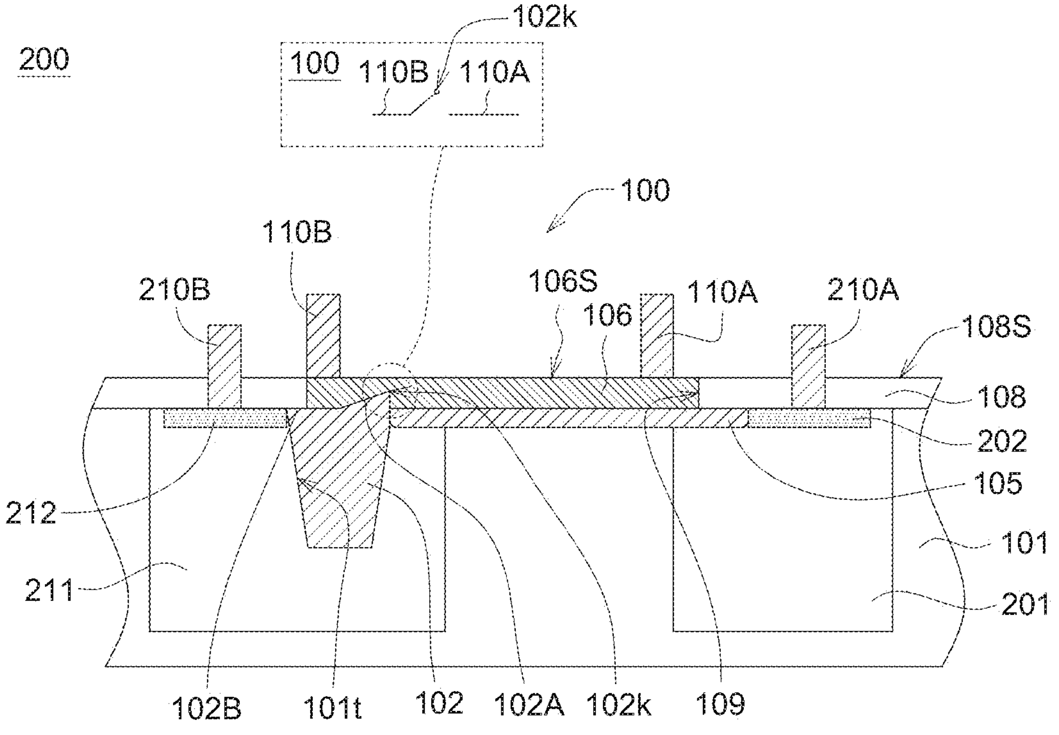
FIG. 2 is a cross-sectional view illustrating a metal-oxide-semiconductor (MOS) transistor having an electric fuse structure according to an embodiment of the present disclosure.

For example, in some embodiments of the present disclosure, the electric fuse structure of the programmable device 100 can also be integrated within the structure of other semiconductor device, such as a MOS transistor device 200, in an IC, and the manufacturing process for fabricating the same. FIG. 2 is a cross-sectional view illustrating a MOS transistor device 200 having an electric fuse structure according to an embodiment of the present disclosure. Since the steps for fabricating the MOS transistor device 200 are substantially the same as those for fabricating the programmable device 100, and the difference is the subsequent steps performed after the forming of the planarized conductive layer 106, thus the same process steps (as shown in FIGS. 1A to 1I) will not be redundantly repeated here.

In the present embodiment, after the planarized conductive layer 106 is formed, at least one ion implantation process can be performed to form a plurality of lightly doped drain (LDD) regions 201 and 211 respectively in the semiconductor substrate 101 on both sides of the semiconductor oxide layer 105, so as to make the buried insulator 102 can be embedded in the LDD region 202, and to make these two LDD regions 201 and 211 separated from each other both by the buried insulator 102 and the semiconductor oxide layer 105.

After that, another ion implantation process is performed to form source/drain regions 202 and 212 respectively in the LDD regions 201 and 211. Wherein, the source/drain regions 202 and 212 are isolated from each other; the source/drain region 202 is adjacent to the side of the semiconductor oxide layer 105 away from the buried insulator 102; and the source/drain region 212 is adjacent to the buried insulator 102.

Subsequently, a series of downstream processes, such as a metal damascene process, are performed to form at least one first contact structure (e.g., conductive pad) 110A on a first conductive region 106A of the planarized conductive layer 106 corresponding to the semiconductor oxide layer 105, to form at least one second contact structure (e.g., conductive pad) 110B on a second conductive region 106B of the planarized conductive layer 106 corresponding to the second insulating portion 102B of the buried insulator 102, and to form plugs 210A and 210B passing through the interlayer dielectric layer 108 and respectively contacting with the source/drain regions 202 and 212, so as to complete the preparation of the MOS transistor device 200. Wherein, the semiconductor oxide layer 105 can serve as a gate dielectric layer of the MOS transistor device 200, and a portion of the planarized conductive layer 106 disposed above the semiconductor oxide layer 105 can serve as a gate electrode of the MOS transistor device 200.

In accordance with the aforementioned embodiments of the present disclosure, a programmable device and the method for fabricating the same are provided. Firstly, a buried insulator (which can be a STI) is formed, extending downward from a surface of a semiconductor substrate. A semiconductor oxide layer (for example, a silicon oxide layer) is then formed by a thermally oxidation process performed on the surface of the semiconductor substrate, so as to make the semiconductor oxide layer contact with the buried insulator. Next, a planarized conductive layer is formed and blankets over the buried insulator and the semiconductor oxide layer. A corner can be formed on a top of the first insulating portion of the buried insulator due to a warping of the buried insulator caused by the push (a thermal stress) of the semiconductor oxide layer applying to the first insulating portion. So that, the first distance between the first insulating portion (at the corner) and the flat surface of the planarized conductive layer is less than the second distance between the unwarped second insulating portion and the flat surface of the planarized conductive layer. Subsequently, a first contact structure is formed on a first conductive region of the planarized conductive layer corresponding to the second insulating portion, and a second contact structure is formed on a second conductive region of the planarized conductive layer corresponding to the semiconductor oxide layer.

Since the thickness of the portion of the planarized conductive layer corresponding to the first insulating portion (the corner) is thinner than the other portions of the planarized conductive layer, thus it can serve as a programmable device having an electric fuse structure. Moreover, the process steps for making the programmable device can be integrated with the standard process steps for making existing semiconductor devices. Therefore, the electric fuse structure can be provided through the standard manufacturing processes for fabricating the existing semiconductor device without applying additional photomask (reticle) and manufacturing process other than the standard manufacturing processes, which can greatly improve the yield and process efficiency of semiconductor devices.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A programmable device, comprising:

a semiconductor substrate;

a buried insulator, disposed in the semiconductor substrate and having a first insulating portion and a second insulating portion connected to each other;

a semiconductor oxide layer, at least partially disposed in the semiconductor substrate and contacting with the first insulating portion; and a planarized conductive layer, at least partially covering the first insulating portion, the second insulating portion and the semiconductor oxide layer, and having a flat surface;

wherein a first distance between the first insulating portion and the flat surface is smaller than a second distance between the second insulating portion and the flat surface.

2. The programmable device according to claim 1, wherein the first insulating portion protrudes above a surface of the semiconductor substrate.

3. The programmable device according to claim 1, wherein the semiconductor substrate has a first opening extending into the semiconductor substrate from a surface of the semiconductor substrate, and the semiconductor oxide layer fills in the first opening to contact with the first insulating portion.

4. The programmable device according to claim 3, further comprising a dielectric layer formed on the surface of the semiconductor substrate and having a second opening, from which the first insulating portion and the semiconductor oxide layer are at least partially exposed, and allowing the planarized conductive layer to fill in the second opening.

5. The programmable device according to claim 1, further comprising:

a first contact structure, electrically contacting to a first conductive region of the planarized conductive layer corresponding to the semiconductor oxide layer; and a second contact structure, electrically contacting to a second conductive region of the planarized conductive layer corresponding to the second insulating portion.

6. The programmable device according to claim 1, further comprising:

a source region, disposed in the semiconductor substrate; and a drain region, disposed in the semiconductor substrate, and separated from the source region both by the buried insulator and the semiconductor oxide layer.

7. The programmable device according to claim 6, wherein the buried insulator is a shallow trench isolation structure (STI) embedded in a lightly doped drain (LDD) region of the source region or the drain region.

8. The programmable device according to claim 1, wherein a ratio of the first distance to the second distance (D1/D2) ranges between 0.2 and 0.4.

9. A method for fabricating a programmable device, comprising:

providing a semiconductor substrate;

forming a buried insulator in the semiconductor substrate, wherein the buried insulator has a first insulating portion and a second insulating portion connected to each other;

forming a semiconductor oxide layer at least partially disposed in the semiconductor substrate and contacting with the first insulating portion;

forming a planarized conductive layer to at least partially cover the first insulating portion, the second insulating portion and the semiconductor oxide layer, wherein the planarized conductive layer has a flat surface; and a first distance between the first insulating portion and the flat surface is smaller than a second distance between the second insulating portion and the flat surface.

10. The method according to claim 9, wherein forming the buried insulator comprises:

forming a trench on a surface of the semiconductor substrate;

depositing a dielectric material on the surface of the semiconductor substrate and filling the trench; and removing a portion of the dielectric material disposed above the surface of the semiconductor substrate.

11. The method according to claim 10, wherein forming the semiconductor oxide layer comprises:

forming a first opening to expose a portion of the semiconductor substrate and a sidewall of the first insulating portion; and performing a thermal oxidation process to form the semiconductor oxide layer in the first opening and contacting the sidewall of the first insulating portion.

12. The method according to claim 10, wherein forming the planarized conductive layer t comprises:

forming a dielectric layer on the surface of the semiconductor substrate;

patterning the dielectric layer to form a second opening exposing the first insulating portion and at least a portion of the semiconductor oxide layer;

depositing a conductive material over the dielectric layer and filling the second opening; and planarizing the conductive material.

13. The method according to claim 9, further comprising:

forming a first contact structure electrically contacting to a first conductive region of the planarized conductive layer corresponding to the semiconductor oxide layer; and forming a second contact structure electrically contacting to a second conductive region of the planarized conductive layer corresponding to the second insulating portion.

14. The method according to claim 9, further comprising:

forming a source region in the semiconductor substrate; and forming a drain region in the semiconductor substrate and separated from the source region both by the buried insulator and the semiconductor oxide layer.

15. The method according to claim 9, further comprising forming a LDD region in the semiconductor substrate to allow the buried insulator embedded in the LDD region.

* * * * *